(12) United States Patent
Tsiang et al.

(10) Patent No.: US 9,490,116 B2
(45) Date of Patent: Nov. 8, 2016

(54) GATE STACK MATERIALS FOR SEMICONDUCTOR APPLICATIONS FOR LITHOGRAPHIC OVERLAY IMPROVEMENT

(71) Applicant: Applied Materials, Inc., Santa Clara, CA (US)

(72) Inventors: Michael Tsiang, Fremont, CA (US); Praket P. Jha, San Jose, CA (US); Xinhai Han, Fremont, CA (US); Nagarajan Rajagopalan, Santa Clara, CA (US); Bok Hoen Kim, San Jose, CA (US); Tsutomu Kiyohara, Santa Clara, CA (US); Subbalakshmi Sreekala, Milpitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/879,043

(22) Filed: Oct. 8, 2015

(65) Prior Publication Data
US 2016/0203971 A1 Jul. 14, 2016

Related U.S. Application Data

(60) Provisional application No. 62/101,817, filed on Jan. 9, 2015.

(51) Int. Cl.
*H01L 21/31* (2006.01)
*H01L 21/469* (2006.01)
(Continued)

(52) U.S. Cl.
CPC ..... *H01L 21/0217* (2013.01); *H01L 21/02274* (2013.01); *H01L 27/11582* (2013.01)

(58) Field of Classification Search
CPC .................. H01L 2924/14; H01L 21/02164; H01L 21/0217; H01L 21/02274; H01L 2924/05042; H01L 21/0214; H01L 24/11

USPC ....... 438/769, 771, 776, 787, 788, 791, 792; 257/798

See application file for complete search history.

(56) References Cited

U.S. PATENT DOCUMENTS

| 5,855,998 A | * | 1/1999 | Tanabe ................... B24B 37/04 257/E21.23 |
| 7,129,187 B2 | * | 10/2006 | Joe ......................... C23C 16/30 257/E21.263 |

(Continued)

FOREIGN PATENT DOCUMENTS

| JP | 2008507130 A | 3/2008 |
| KR | 20120021222 A | 3/2012 |

OTHER PUBLICATIONS

International Search Report and Written Opinion for PCT/US2015/064684 dated Feb. 29, 2016 (9 pgs.).

*Primary Examiner* — S. V. Clark
(74) *Attorney, Agent, or Firm* — Patterson & Sheridan, LLP (57) ABSTRACT

Embodiments of the disclosure provide methods and system for manufacturing film layers with minimum lithographic overlay errors on a semiconductor substrate. In one embodiment, a method for forming a film layer on a substrate includes supplying a deposition gas mixture including a silicon containing gas and a reacting gas onto a substrate disposed on a substrate support in a processing chamber, forming a plasma in the presence of the depositing gas mixture in the processing chamber, applying current to a plasma profile modulator disposed in the processing chamber while supplying the depositing gas mixture into the processing chamber, and rotating the substrate while depositing a film layer on the substrate.

20 Claims, 6 Drawing Sheets

(51) Int. Cl.
   *H01L 21/02*   (2006.01)
   *H01L 27/115*  (2006.01)

(56) References Cited

U.S. PATENT DOCUMENTS

| | | | | |
|---|---|---|---|---|
| 8,436,366 | B2* | 5/2013 | Harada | H01L 29/808 |
| | | | | 257/627 |
| 2007/0231934 | A1* | 10/2007 | Sato | H01L 21/67069 |
| | | | | 438/14 |
| 2009/0230089 | A1 | 9/2009 | Bera et al. | |
| 2011/0312159 | A1* | 12/2011 | Saxler | H01L 21/02381 |
| | | | | 438/478 |
| 2012/0045904 | A1 | 2/2012 | Choi | |
| 2012/0227014 | A1 | 9/2012 | Pforr | |
| 2013/0044331 | A1 | 2/2013 | Manassen et al. | |
| 2013/0189854 | A1* | 7/2013 | Hausmann | H01L 21/0217 |
| | | | | 438/792 |
| 2013/0210241 | A1* | 8/2013 | LaVoie | H01L 21/02164 |
| | | | | 438/791 |
| 2013/0306240 | A1 | 11/2013 | Ni et al. | |
| 2014/0017604 | A1 | 1/2014 | Lee et al. | |
| 2014/0036243 | A1 | 2/2014 | Beyer et al. | |
| 2014/0051262 | A9* | 2/2014 | Lavoie | H01L 21/02126 |
| | | | | 438/776 |
| 2015/0376785 | A1* | 12/2015 | Knaapen | C23C 16/45551 |
| | | | | 427/557 |
| 2016/0099147 | A1* | 4/2016 | Kulshreshtha | C23C 16/26 |
| | | | | 438/16 |

* cited by examiner

GATE STACK MATERIALS FOR SEMICONDUCTOR APPLICATIONS FOR LITHOGRAPHIC OVERLAY IMPROVEMENT

CROSS-REFERENCE TO RELATED APPLICATIONS

This application claims benefit of U.S. Provisional Application Ser. No. 62/101,817 filed Jan. 9, 2015, which is incorporated by reference in its entirety.

BACKGROUND

1. Field of the Disclosure

Embodiments of the disclosure generally relate to methods for forming a dielectric layer with minimum contribution to lithographic overlay errors, more specifically, methods for forming a dielectric layer with minimum contribution to lithographic overlay errors used in gate stack materials for semiconductor applications.

2. Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Typically, devices on semiconductor substrates are manufactured by a sequence of lithographic processing steps in which the devices are formed from a plurality of overlying layers, each having an individual pattern. Generally, a set of 15 to 100 masks is used to construct a chip and can be used repeatedly.

Between one layer and the next layer that overlays the previous one, the individual patterns of the one layer and the next layer must be aligned. A measurement of alignment marks may be obtained by a metrology tool which is then used by a lithography tool to align the subsequent layers during exposure and again after a lithography process to recheck a performance of the alignment. However, overlay errors (or pattern registration errors) between layers are inevitable, and error budgets are calculated by IC designers for which the manufacturing must meet. Overlay errors of the device structure may originate from different error sources, such as overlay errors from previous exposure tool/metrology tool, substrate warpage, current exposure tool/metrology tool limitation, a matching error between the overlay errors of the previous exposure tool/metrology tool and of the current exposure tool/metrology tool, or substrate film layer deformation caused by film stress and the like.

Figure 1:
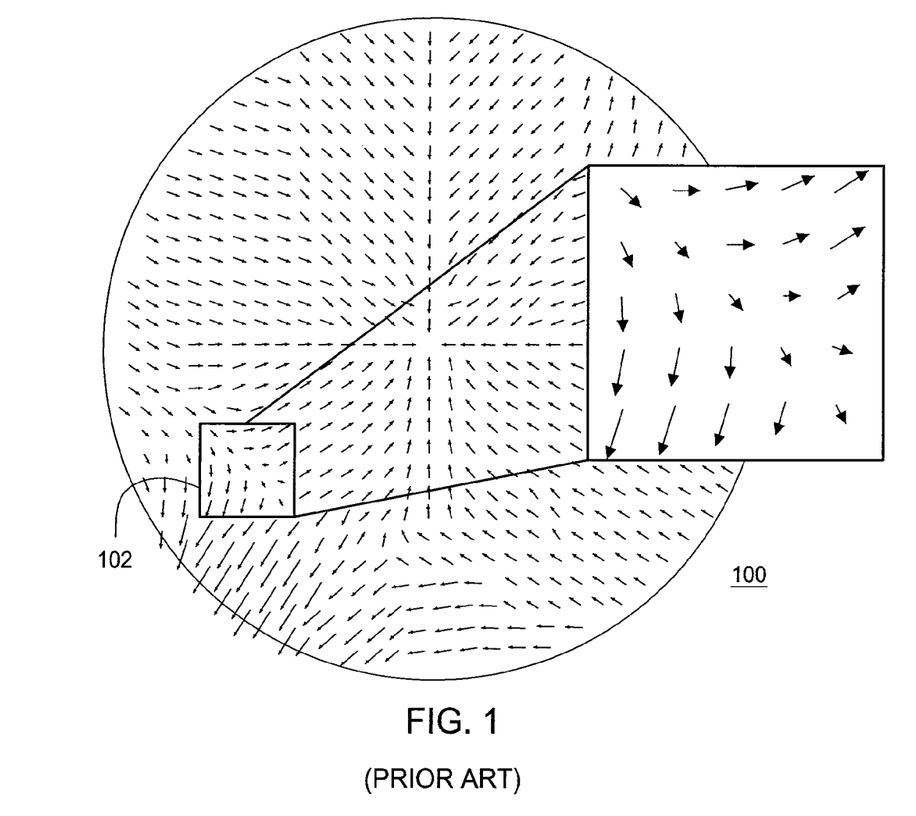
FIG. 1 depicts an overlay error map of a semiconductor substrate measured after a sequence of lithographic processes.

FIG. 1 depicts an overlay error map 100 of a semiconductor substrate measured after a sequence of lithographic exposure processes. In the embodiment of FIG. 1, some patterns shown in an enlarged portion 102 of the substrate are shifted or displaced, e.g., in-plane displacement (IPD), from their designed location. As discussed above, displacement or misalignment of the patterns creates overlay errors that may be detriment to device performance. However, when overlay errors or in-plane displacement (IPD) undesirably occurs, the size, dimension or structures of dies formed on the substrate may be irregularly deformed or distorted, thus increasing likelihood of misalignment between the film layers stacked thereon that may adversely increase the probability of misalignment in the subsequent lithographic exposure process.

With the shrink of critical dimensions (CD), overlay error in the critical layers of the device structure must be minimal or eliminated in order to reliably produce devices with minimal feature sizes, such as a width of a control gate in a device. Overlay specifications have become more challenging that the non-lithographic contributions (i.e., film stress) to overlay errors through stress induced substrate distortion, may alone exceed the error budget.

Therefore, there exists a need for improved methods and system to minimum overlay errors for film layers formed for manufacturing the devices so as to improve device performance and maintain predicable product reliability and yield.

SUMMARY

Embodiments of the disclosure provide methods and system for manufacturing film layers with minimum lithographic overlay errors on a semiconductor substrate. In one embodiment, a method for forming a film layer on a substrate includes supplying a deposition gas mixture including a silicon containing gas and a reacting gas onto a substrate disposed on a substrate support in a processing chamber, forming a plasma in the presence of the depositing gas mixture in the processing chamber, applying current to a plasma profile modulator disposed in the processing chamber while supplying the depositing gas mixture into the processing chamber, and rotating the substrate while depositing a film layer on the substrate.

In another embodiment, a method for forming a film layer on a substrate includes controlling a plasma generated from a gas mixture in a processing chamber by applying current to a plasma profile modulator disposed in the processing chamber, and forming a film layer on a substrate with the controlled plasma, wherein the film layer has a local bow range less than 50 μm.

In yet another embodiment, a film structure includes a film stack includes a first film layer and a second film layer disposed on the first layer, wherein the first film layer and the second film layer are alternatively and repeatedly formed in the film stack with a total thickness between about 600 nm and about 4000 nm, wherein the film stack has a local bow range less than 200 μm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Embodiments of the disclosure describe an apparatus and a method for depositing a film layer that may have minimum contribution to overlay error after a sequence of deposition and lithographic exposure processes. In one example, the deposition method may form a film layer with minimum stress variation or in-plane displacement across the film layer surface so as to provide consistent film stress in each film layer as formed on the substrate. By doing so, the overlay error may be minimized and/or eliminated when integrating all film layers to form semiconductor devices so that alignment precision is increased for the next lithographic exposure process. The deposition method may utilize an apparatus with a plasma profile modulator to provide an uniform plasma generated during deposition as well as rotating the substrate while depositing.

Figure 2:
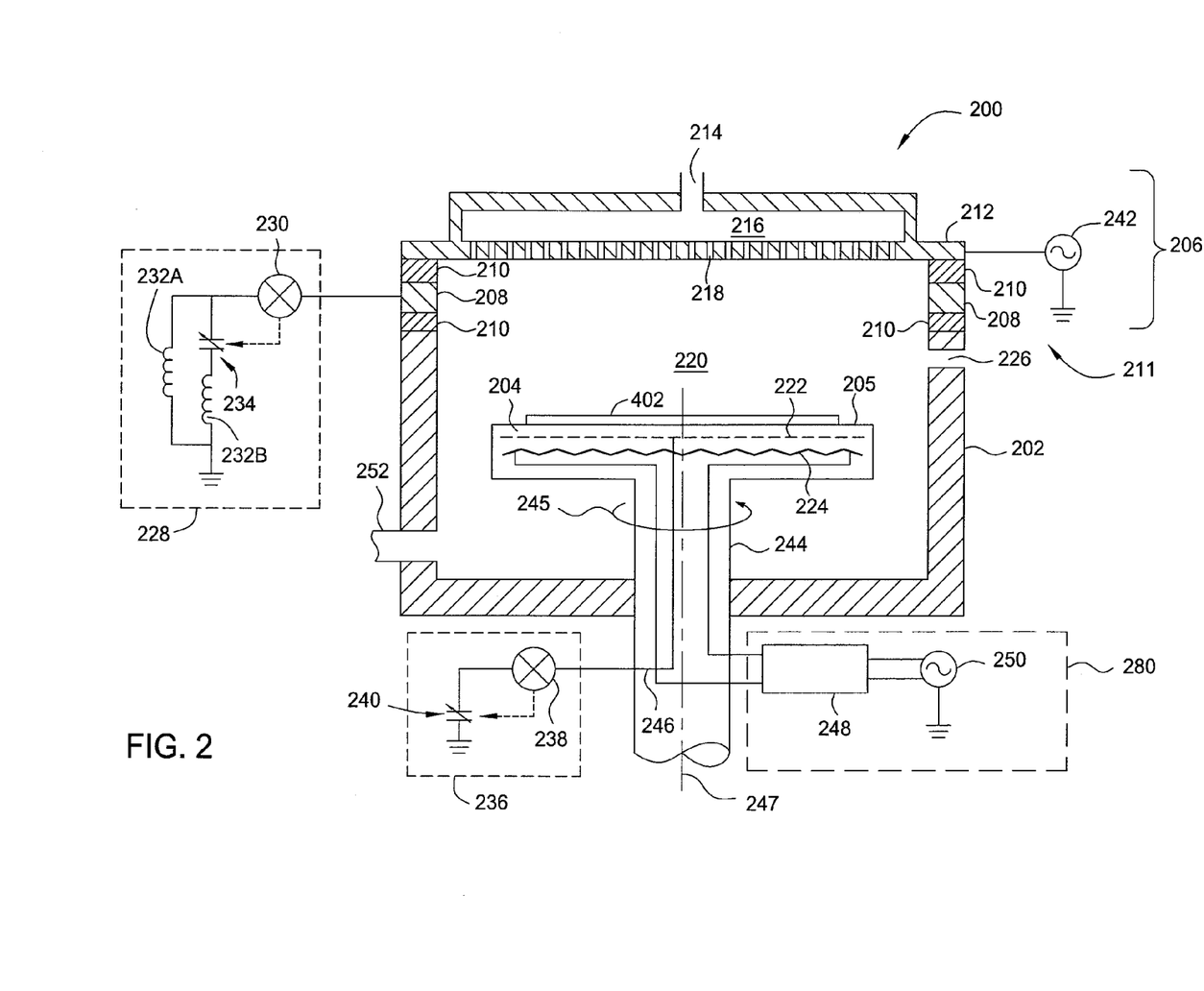
FIG. 2 depicts a deposition apparatus that may be utilized to form film layers overlay errors on a semiconductor substrate.

FIG. 2 is a schematic side view of a processing chamber 200 that may be used to practice processes described herein. The processing chamber 200 features a chamber body 202, a substrate support 204 disposed inside the chamber body 202, and a lid assembly 206 coupled to the chamber body 202 and enclosing the substrate support 204 in a processing volume 220. A substrate 402 is provided to the processing volume 220 through an opening 226, which may be conventionally sealed for processing using a door. The substrate support 204 may be rotatable, as indicated by the arrow 245, along an axis 247, where a shaft 244 of the substrate support 204 is located. Alternatively, the substrate support 204 may be lifted up to rotate as necessary during a deposition process.

A plasma profile modulator 211 may be disposed in the processing chamber 200 to control plasma distribution across the substrate 402 disposed on the substrate support 204. The plasma profile modulator 211 includes a first electrode 208 that may be disposed adjacent to the chamber body 202 and separate the chamber body 202 from other components of the lid assembly 206. The electrode 208 may be part of the lid assembly 206, or may be a separate side wall electrode. The electrode 208 may be an annular, or ring-like member, and may be a ring electrode. The electrode 208 may be a continuous loop around a circumference of the processing chamber 200 surrounding the processing volume 220, or may be discontinuous at selected locations if desired. The electrode 208 may also be a perforated electrode, such as a perforated ring or a mesh electrode. The electrode 208 may also be a plate electrode, for example a secondary gas distributor.

An isolator 210, which may be a dielectric material such as a ceramic or metal oxide, for example aluminum oxide and/or aluminum nitride, contacts the electrode 208 and separates the electrode 208 electrically and thermally from a gas distributor 212 and from the chamber body 202. The gas distributor 212 features openings 218 for admitting process gases into the processing volume 220. The gas distributor 212 may be coupled to a source of electric power (power source) 242, such as an RF generator, RF power source, DC power, pulsed DC power, and pulsed RF power may also be used. In one example, the electric power source 242 is an RF power source.

The gas distributor 212 may be a conductive gas distributor or a non-conductive gas distributor. The gas distributor 212 may also be made of conductive and non-conductive components. For example, a body of the gas distributor 212 may be conductive while a face plate of the gas distributor 212 is non-conductive. The gas distributor 212 may be powered, such as by the power source 242 as shown in FIG. 2, or the gas distributor 212 may be coupled to ground.

The electrode 208 may be coupled to a tuning circuit 228 that controls a ground pathway of the processing chamber 200. The tuning circuit 228 comprises an electronic sensor 230 and an electronic controller 234. The electronic controller 234 may be or include a variable capacitor or other circuit element(s). The tuning circuit 228 may be or include one or more inductors 232. The tuning circuit 228 may be any circuit that enables variable or controllable impedance under the plasma conditions present in the processing volume 220 during processing. In the example of FIG. 2, the tuning circuit 228 features a first circuit leg and a second circuit leg coupled in parallel between ground and the electronic sensor 230. The first circuit leg includes a first inductor 232A. The second circuit leg includes a second inductor 232B coupled in series with the electronic controller 234. The second inductor 232B disposed between the electronic controller 234 and the node connecting both the first and second circuit legs to the electronic sensor 230. The electronic sensor 230 may be a voltage or current sensor, and may be coupled to the electronic controller 234 to afford a degree of closed-loop control of plasma conditions inside the processing volume 220.

A second electrode 222 may be coupled to the substrate support 204. The second electrode 222 may be embedded within the substrate support 204 or coupled to a surface of the substrate support 204. The second electrode 222 may be a plate, a perforated plate, a mesh, a wire screen, or any other distributed arrangement of conductive elements. The second electrode 222 may be a tuning electrode, and may be coupled to a second tuning circuit 236 by a conduit 246, for example a cable having a selected resistance, such as 50 ohms (Ω), disposed in the shaft 244 of the substrate support 204. The second tuning circuit 236 may have a second electronic sensor 238 and a second electronic controller 240, which may be a second variable capacitor. The second electronic sensor 238 may be a voltage or current sensor, and may be coupled to the second electronic controller 240 to provide further control over plasma conditions in the processing volume 220.

A third electrode 224, which may be a bias electrode and/or an electrostatic chucking electrode, may be coupled to the substrate support 204. The third electrode may be coupled to a second source of electric power (second power source) 250 through a filter 248, which may be an impedance matching circuit. The second source of electric power 250 may be DC power, pulsed DC power, RF bias power, pulsed RF source or bias power, or a combination thereof. In one example, the second source of electric power 250 is a RF bias power.

The lid assembly 206 and substrate support 204 of FIG. 2 may be used with any processing chamber for plasma or thermal processing. One example of a plasma processing chamber with which the lid assembly 206 and substrate support 204 may be beneficially used is the PRODUCER® or PRECISION® platform and chambers available from Applied Materials, Inc., located in Santa Clara, Calif. Chambers from other manufacturers may also be used with the components described above.

In operation, the processing chamber 200 affords real-time control of plasma conditions in the processing volume 220. The substrate 402 is disposed on the substrate support 204, and process gases are flowed through the lid assembly 206 using an inlet 214 according to any desired flow plan. Gases exit the processing chamber 200 through an outlet 252. Electric power is coupled to the gas distributor 212 to establish a plasma in the processing volume 220. The substrate may be subjected to an electrical bias using the third electrode 224, if desired.

Upon energizing a plasma in the processing volume 220, a potential difference is established between the plasma and the first electrode 208. A potential difference is also established between the plasma and the second electrode 222. The electronic controllers 234, 240 may then be used to adjust the flow properties of the ground paths represented by the two tuning circuits 228 and 236. A set point may be delivered to the first tuning circuit 228 and the second tuning circuit 236 to provide independent control of deposition rate and of plasma density uniformity from center to edge. In embodiments where the electronic controllers are both variable capacitors, the electronic sensors may adjust the variable capacitors to maximize deposition rate and minimize thickness non-uniformity independently.

Each of the tuning circuits 228, 236 has a variable impedance that may be adjusted using the respective electronic controllers 234, 240. Where the electronic controllers 234, 240 are variable capacitors, the capacitance range of each of the variable capacitors, and the inductances of the inductors 232A, 232B, are chosen to provide an impedance range, depending on the frequency and voltage characteristics of the plasma, that has a minimum in the capacitance range of each variable capacitor. Thus, when the capacitance of the electronic controller 234 is at a minimum or maximum, impedance of the circuit 228 is high, resulting in a plasma shape that has a minimum aerial (lateral) coverage over the substrate support. When the capacitance of the electronic controller 234 approaches a value that minimizes the impedance of the circuit 228, the aerial coverage of the plasma grows to a maximum, effectively covering the entire working area of the substrate support 204. As the capacitance of the electronic controller 234 deviates from the minimum impedance setting, the plasma shape shrinks from the chamber walls and aerial coverage of the substrate support declines. The electronic controller 240 has a similar effect, increasing and decreasing aerial coverage of the plasma over the substrate support as the capacitance of the electronic controller 240 is changed.

The electronic sensors 230, 238 may be used to tune the respective circuits 228, 236 in a closed loop. A set point for current or voltage, depending on the type of sensor used, may be installed in each sensor, and the sensor may be provided with control software that determines an adjustment to each respective electronic controller 234, 240 to minimize deviation from the set point. In this way, a plasma shape can be selected and dynamically controlled during processing. It should be noted that, while the foregoing discussion is based on electronic controllers 234, 240 that are variable capacitors, any electronic component with adjustable characteristic may be used to provide tuning circuits 228 and 236 with adjustable impedance.

Figure 3:
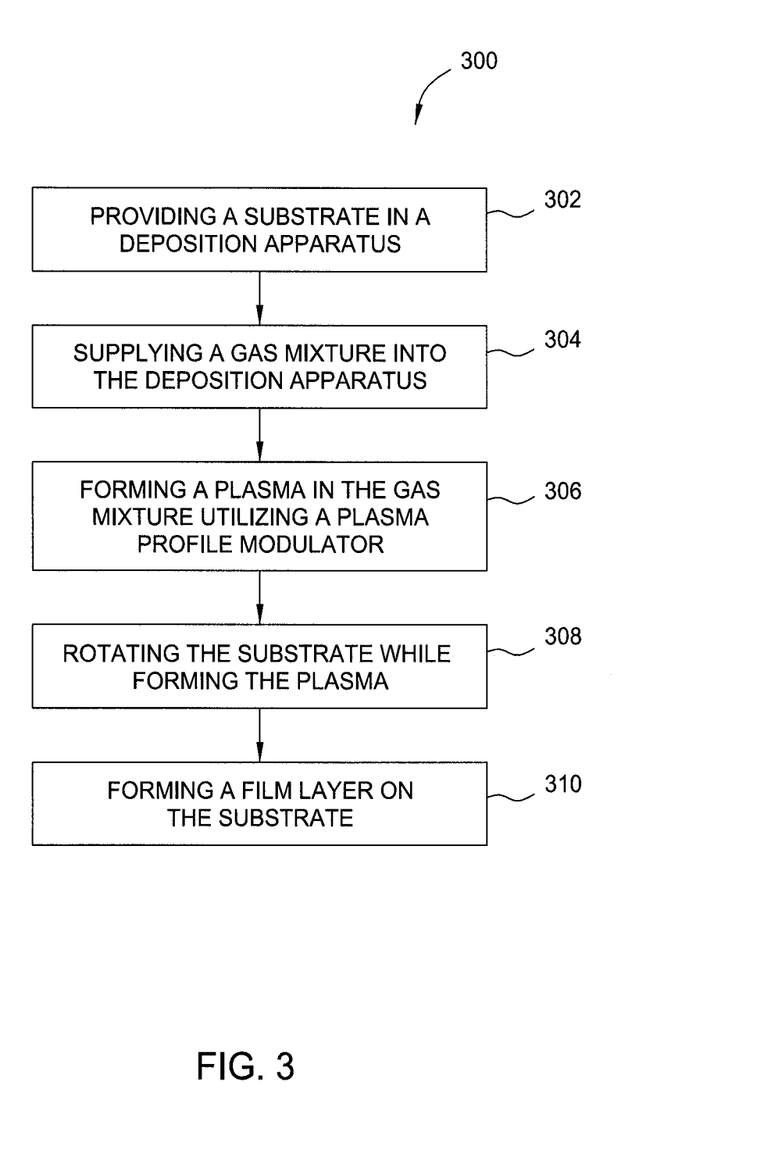
FIG. 3 depicts a flow diagram of a method of manufacturing a film layer with a desired range of stress on a semiconductor substrate.

FIG. 3 illustrates a method 300 for forming a film layer, such as a dielectric layer, on a substrate, which may be later utilized to form a gate structure for semiconductor devices. In one example, the film layer may be utilized to form gate structures for three dimensional (3D) NAND semiconductor applications. In manufacturing three dimensional (3D) NAND semiconductor applications, stair-like oxide-nitride pairs of structures are often utilized to high aspect ratio gate stack NAND cells so as to increase circuit density.

Figure 4A:
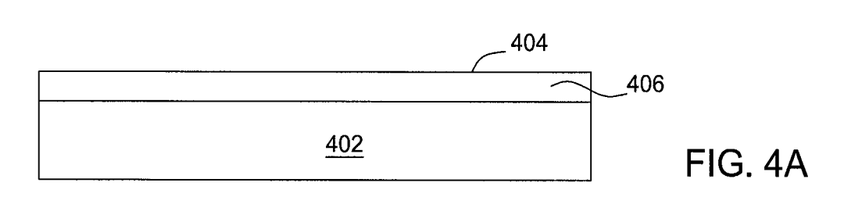
FIGS. 4A-4B depict cross-sectional views of a film layer with a desired range of stress deposited on a semiconductor substrate in accordance with the manufacturing method of FIG. 3.
Figure 4B:
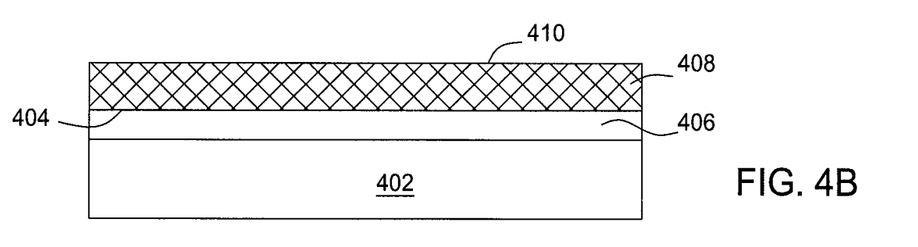

The sequence described in FIG. 3 corresponds to the fabrication stages depicted in FIGS. 4A-4B, which is discussed below. FIGS. 4A-4B illustrate schematic cross-sectional views of the substrate 402 having at least a first film layer 406 disposed on a surface 404 of the first film layer 406. In one embodiment, the first film layer 406 may be a dielectric layer, such as a silicon oxide containing layer, a silicon nitride containing layer, a silicon carbide containing layer, and the like. In an example wherein the first film layer 406 is not present, the deposition process may be performed directly on the substrate 402.

The method 300 begins at operation 302 with a substrate, such as the substrate 402 depicted in FIG. 4A, disposed into the processing chamber, such as the processing chamber 200 depicted in FIG. 2, or other suitable processing chamber. The substrate 402 shown in FIG. 4A includes the first film layer 406 formed on the substrate 402. In one example, the substrate 402 may have a substantially planar surface, an uneven surface, or a substantially planar surface having a structure formed thereon. The substrate 402 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 402 may have various dimensions, such as 200 mm or 300 mm diameter wafers, as well as, rectangular or square panels. Unless otherwise noted, embodiments and examples described herein are conducted on substrates with one of a 200 mm diameter, a 300 mm diameter, and a 450 mm diameter. In the example wherein a SOI structure is utilized for the substrate 402, the substrate 402 may include a buried dielectric layer disposed on a silicon crystalline substrate. In the embodiment depicted herein, the substrate 402 may be a crystalline silicon substrate.

In one example, the first film layer 406 is may be a silicon oxide containing layer, a silicon nitride containing layer, a silicon containing layer, such as amorphous silicon, polycrystalline silicon or any suitable crystalline silicon layers. In the example depicted in FIG. 4A, the first film layer 406 is a silicon oxide containing layer, such as a silicon oxide layer.

At operation 304, a deposition gas mixture is provided into the processing chamber. The deposition gas mixture may include a silicon containing gas and a reacting gas. Suitable examples of the silicon containing gas include, but not limited to, silane ($SiH_4$), di-silane($Si_2H_6$), silicon tetrafluoride ($SiF_4$), silicon tetrachloride($SiCl_4$), dichlorsilane ($SiH_2Cl_2$), tetraethyl orthosilicate (TEOS), and the like.

The reacting gas may be an oxygen containing gas, for forming a silicon oxide containing layer, a nitrogen containing gas, for forming a silicon nitride containing layer, or a carbon containing gas, for forming a silicon carbide containing layer. Suitable examples of the oxygen containing gas include $O_2$, $N_2O$, $NO_2$, $O_3$, $H_2O$ and the like. Suitable examples of the nitrogen containing gas include $N_2$, $N_2O$, $NO_2$, $NH_3$, $N_2H_2$ and the like. Suitable examples of the carbon containing gas include $CO_2$, CO, $CH_4$, $CF_4$, other suitable carbon based polymer gases and the like. In one example depicted here, the silicon containing gas is silane ($SiH_4$) and the reacting gas is a nitrogen containing gas, such as $N_2$, $N_2O$ or $NH_3$, to form a second film layer 408, such as a silicon nitride containing layer, depicted in FIG. 4B, which will be described in greater detail below.

In one example, the gas ratio of the silicon containing gas, such as $SiH_4$ gas, and reacting gas, such as nitrogen containing gas ($N_2$, $N_2O$ or $NH_3$ gas) is maintained to control reaction behavior of the gas mixture, thereby allowing a desired proportion of the nitrogen elements in the formed silicon film. In one embodiment, the $SiH_4$ gas may be supplied at a flow rate between about 40 sccm and about 200 sccm and the $N_2$, $N_2O$ or $NH_3$ gas may be supplied at a flow rate at between about 500 sccm and about 9000 sccm. The gas mixture of $SiH_4$ gas and $N_2$, $N_2O$ or $NH_3$ gas may be supplied at a ratio of $SiH_4$ to $N_2$ or $NH_3$ gas of between about 1:1 and about 1:150, such as between about 1:1 and about 1:120, for example, about 1:100.

Alternatively, one or more inert gases may be included in the deposition gas mixture provided to the processing chamber 200. The inert gas may include, but not limited to, noble gas, such as Ar, He, and Xe, or $N_2$ and the like. The inert gas may be supplied to the processing chamber 200 at a flow ratio of inert gas to $SiH_4$ gas of between about 1:1 and about 1:150.

Several process parameters are regulated while the deposition gas mixture is supplied into the processing chamber. In one embodiment, a pressure of the process gas mixture in the deposition processing chamber is regulated between about 10 mTorr to about 15 Torr, and the substrate temperature is maintained between about 200 degrees Celsius and about 700 degrees Celsius.

At operation 306, while supplying the deposition gas mixture into the processing chamber, an RF source power may be generated by the power source 242 (depicted in FIG. 2) and coupled to the gas mixture to assist dissociating the deposition gas mixture into reactive species in a plasma.

The RF source and/or bias power energizes the deposition gas mixture within the processing volume 220 such that the plasma may be sustained. In one example, the power source 242 may be operated to provide RF power at a frequency between 0.3 MHz and about 14 MHz, such as about 13.56 MHz. The power source 242 may generate RF power at about 10 Watts to about 5000 Watts, such as about 500 Watts. In some embodiments, in addition to the RF source power, the RF bias power provided by the second power source 250 (depicted in FIG. 2) may also be utilized during the deposition process to assist dissociating the deposition gas mixture forming the plasma. In one example, the power source 242 may be operated to provide RF power at a frequency between 0.3 MHz and about 14 MHz, such as about 13.56 MHz. The RF bias power may be supplied at between about 10 Watts and about 100 Watts at a frequency of 300 kHz. In one embodiment, the RF bias power may be pulsed with a duty cycle between about 10 to about 95 percent at a RF frequency between about 500 Hz and about 10 kHz.

Furthermore, current/voltage may be supplied to the plasma profile modulator 211 to assist controlling profile and distribution of the plasma across the substrate 402. In one example, the side wall tuning electrode current target (e.g., supplied to the electrode 208) is set to between about 0.5 A and about 40 A, such as about 6 A, and substrate support tuning electrode current target (e.g., supplied to the second electrode 222) is set to between about 0.5 A and about 40 A, such as about 6 A, to assist controlling the plasma as generated in the processing volume 220.

At operation 308, while forming the plasma from the deposition gas mixture, the substrate support 204 may be rotated to assist exposing the plasma across the substrate surface in a more uniform manner. The substrate support 204 may be rotated continuously or periodically during deposition of the second film layer 408 on the substrate 402. In one embodiment, the substrate support 204 may rotate about the axis 247 between about 1° and about 360°, such as between about 30° and about 270°, for example, between about 90° and about 180°. The substrate support 204 may be rotated about between 0 rpm and about 100 rpm until a desired thickness of the second film layer 408 is formed on the substrate 402, as shown in FIG. 4B.

At operation 310, after a desired thickness of the second film layer 408 is deposited, the deposition process may then be terminated. In one example, the second film layer 408 may have a thickness between about 10 nm and about 60 nm, such as about 30 nm. In the embodiment wherein the second film layer 408 is a silicon nitride containing layer, such as a silicon nitride layer, the silicon nitride containing layer may have a stress range between about −200 Mpa and about +1200 Mpa with a stress uniformity less than 50%. The second film layer 408 have may a ratio of N element to Si element substantially between about 0.8:1 and about 2:1. The second film layer 408 may have a local bow range less than 50 μm.

It is noted that the stress uniformity (U %) as discussed here means a variation (Δ) of the absolute stress values measured across the substrate surface (e.g., variation between the largest stress value and the smallest stress value obtained from either 9 point, 49 points, or 69 points stress measurement) divided by an average (σ) of the stress (e.g., an average from stress values obtained from 9 point, 49 points, or 69 points stress measurement) measured from the film layer (such as σ/Δ=U %).

Figure 5A:
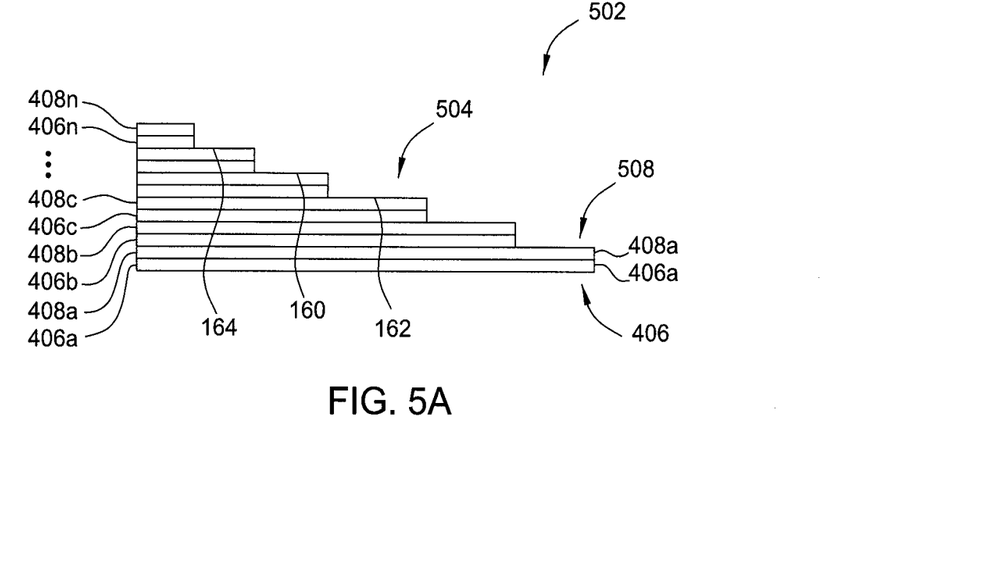
FIG. 5A-5B depict cross-sectional views of a film structure formed on a substrate utilizing the method depicted in FIG. 3.
Figure 5B:
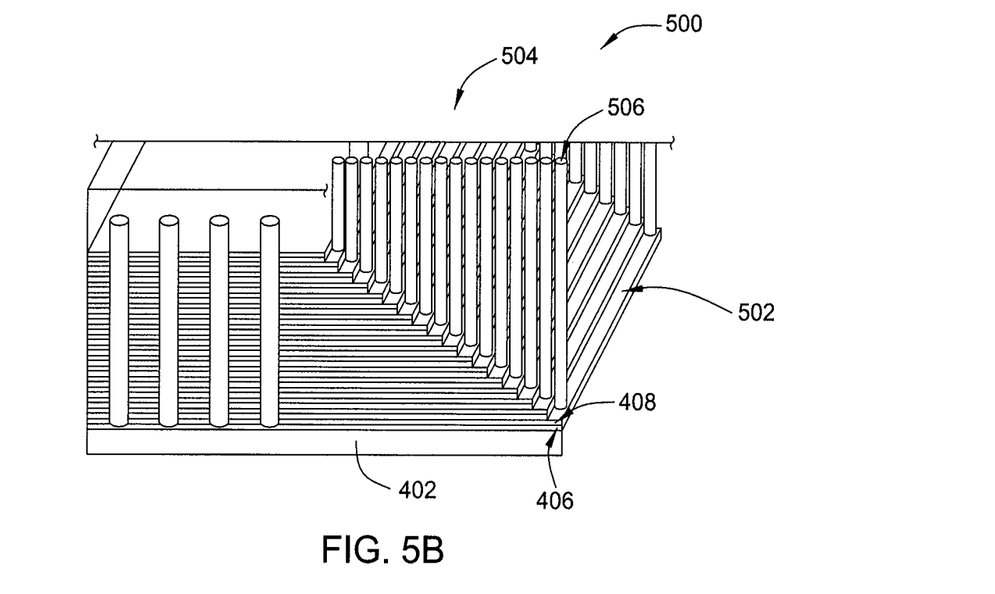

In one example, the deposition processes for forming the first film layer 406 and the second film layer 408 may be performed repeatedly to form a film stack 502, which may be later patterned to form stair-like structures 504 for 3D NAND semiconductor devices, as depicted in a cross sectional view of the stair-like structures 504 illustrated in FIG. 5A. In the example depicted in FIGS. 5A-5B, the film stack 502 typically includes alternating layers of first film layer 406 and the second film layer 408 (shown as 406a, 408a, 406b, 408b, . . . , 406n, 408n). The film stack 502 may have a total thickness between about 600 nm and about 4000 nm. The film stack 502 may include a total of about 5 to 90 pairs of first film layer 406 and the second film layer 408. In the subsequently patterning or etching process, a photoresist layer may be used to sequentially trim to different dimensions while serving as an etch mask formed on the stair-like structure 504 to complete gate structures for the 3D NAND semiconductor devices.

The deposition method 300 of FIG. 3 may be continuously performed to form the film stack 502 with alternating first film layers 406 and second film layers 408. In the example that the first film layer 406 is a silicon oxide layer and the second film layer 408 is a silicon nitride layer, the deposition method 300 of FIG. 3 may be performed by switching different deposition gas mixture at operation 304 to form the film layers 406, 408 with different compositions without removing the substrate 402 from the processing chamber 200 (e.g., without breaking vacuum).

For example, the film stack 502 may be formed by first supplying a first deposition gas mixture (regulated at operation 304) with a first set of process parameters (regulated at operation 306, 308) to form the first film layer 406, such as a silicon oxide layer. The first deposition gas mixture may include at least a silicon containing gas and an oxygen containing gas. After the thickness of a first layer 406a of the first film layer 406 is reached, the deposition process may be looped back to operation 304 to switch the first deposition gas mixture to a second deposition gas mixture (regulated at operation 304) with a second set of process parameters (regulated at operation 306, 308) to form a first layer 408a of the second film layer 408, such as a silicon nitride layer. The second deposition gas mixture may include at least a silicon containing gas and a nitrogen containing gas. Switch between the first and the second deposition gas mixtures may optionally have a pump/purge process to pump/purge the residual gases or deposit byproducts from the processing chamber prior to forming a next film layer on the substrate 402.

By utilizing the plasma profile modulator 211 to control plasma distribution across the substrate surface and rotation of the substrate support 204 during deposition of the first and/or the second film layers 406, 408, a uniform film layer with a uniform stress profile may be obtained so that the substrate warpage, substrate bent, or in-plane displacement may be eliminated/or minimized so as to provide film layers with desired stress uniformity and film properties for the subsequent lithographic process with minimum likelihood of overlay error occurrence. After a deposition process, the film residual stress may undesirably result in substrate bow, warpage or substrate curvature. In such cases, misalignment between the features present on the film layer pattern formed by the lithographic exposure process may become significant, resulting in an overlay error that may result in feature deformation or structure collapse. Additionally, most deposited materials have a native residual stress which induces substrate bow, warpage and grid-distortion simply as a function of their deposition. These stresses are often not uniform across the substrate surface and lead to non-uniform substrate bow, warpage and grid-distortion. The deviation in the film stress distributed across the substrate surface may reflect the degree of overlay error or pattern displacement/shift present on the substrate.

By utilizing the method 300 of FIG. 3, the plasma profile modulator 211 may assist controlling plasma distribution at local position on the substrate surface along with the assistance from rotation of the substrate support during the deposition process, so that localized residual stress in discrete regions of the film layers may be eliminated or reduced so as to locally change the in-plane displacement (or strain, pattern shift, or substrate curvature) in the film layer. By doing so, substantially linear and uniform film properties across the substrate surface may be obtained. The straightened and uniform features allow for reduced overlay errors in the subsequent lithographic exposure process, enhancing alignment precision during the lithographic exposure process. In one embodiment, after the deposition processes, the whole film stack 502 may have stress range between about −100 Mpa and about +100 Mpa with a stress uniformity less than 50%. Alternatively, whole film stack 502 may have a local bow range less than 200 μm.

Furthermore, it is noted that the substrate support 204 may commence rotating when the substrate 402 is positioned on the substrate support (at operation 302), or even prior to the substrate 402 positioning onto the substrate support 204 in preparation for performing the deposition process. Similarly, the substrate support 204 may commence rotating after a deposition process in preparation for the next deposition process to be performed in the processing chamber. It is noted that rotation of the substrate support 204 may be in any arrangements, such as during the deposition process (operation 308), in between deposition processes (prior to operation 302 or after operation 310), prior to performing a deposition process (prior to operation 302), or after a first deposition process (after operation 310) is performed but prior to performing a second deposition process as needed.

Figure 6:
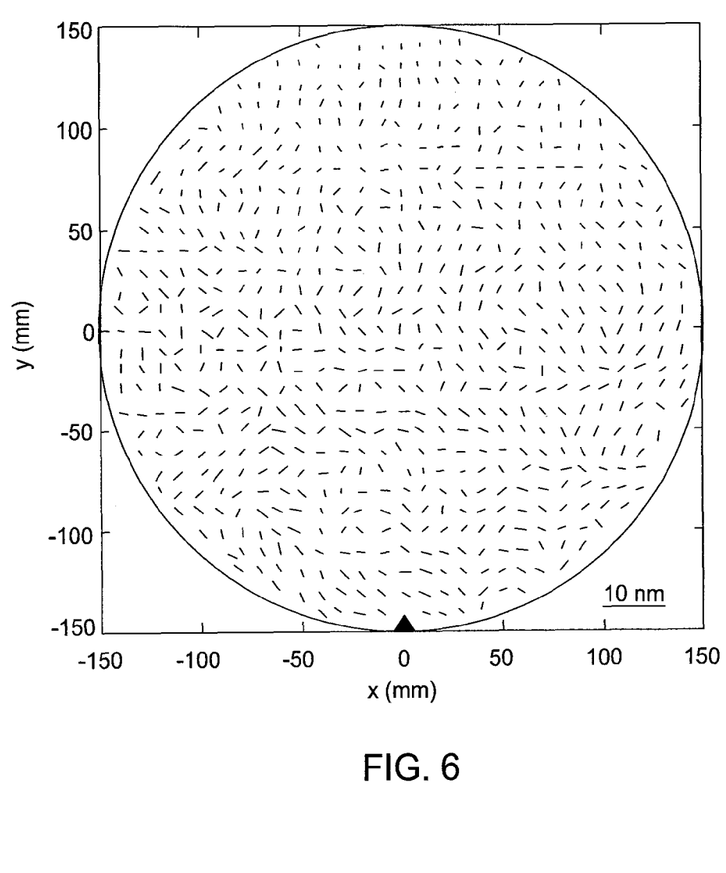
FIG. 6 depicts an overlay error map with film layers formed utilizing the manufacturing method of FIG. 3.

FIG. 6 depict an in-plane displacement map generated after the multiple film stack 502 with alternating first and second film layers (406a, 408a, 406b, 408b, . . . 406n and 408n) are formed on the substrate. The metrology tool may be utilized to scan the semiconductor substrate and determine the overlay error map or substrate distortion may be a metrology tool available from KLA-Tencor® of California. Prior to exposure, one may measure in-plane distortion using a metrology tool such as the KLA Wafer Sight or the Ultratec Superfast 3G. After lithography, one may use a conventional overlay tool to measure actual layer to layer pattern overlay and registration. It is noted that other suitable metrology tools from other manufacturers may also be utilized to perform the scan and measurement process.

In an exemplary example depicted in FIG. 6, by utilizing the plasma profile modulation the substrate support rotation during the deposition method for forming the first and/or and second film layers 406, 408, the in-plane displacement or stress deviation of the substrate is significantly reduced, particularly as compared to that of FIG. 1. The reduction in in-plane displacement or stress deviation of the substrate enhances the alignment precision in the lithographic exposure process, which reduces overlay errors and improves device performance.

It is noted that the materials utilized to form the film layers (such as either the first or the second film layer 406, 408) disposed on the semiconductor layer that may utilize the method depicted in FIG. 3 may be a dielectric material selected from a group consisting of silicon nitride ($Si_3N_4$), silicon nitride hydride ($Si_xN_y$:H), amorphous carbon, silicon carbide, silicon oxide, silicon oxynitride, a composite film of silicon oxide, silicon nitride, silicon carbide or amorphous carbon, an aluminum oxide layer, a tantalum oxide layer, a titanium oxide layer, spin-cast organic polymers, or other suitable material. In another embodiment, film layer may be any suitable polymer organic material, including SOG, polyimide or any suitable materials.

Thus, embodiments of the disclosure provide a deposition process that utilizes a plasma profile modulator along with substrate support rotation during the deposition process so as to provide a film layer with uniform film properties across the substrate surface with minimum in-plane displacement after a sequence of lithographic exposure processes. Utilization of the plasma profile modulator along with substrate support rotation may improve uniformity of film stress/strain distribution in the film layer disposed on the semiconductor substrate. By forming film layers with uniform film properties with minimum stress deviation, the overlay error may be eliminated so as to increase alignment precision for the next lithographic exposure process.

While the foregoing is directed to embodiments of the present disclosure, other and further embodiments of the disclosure may be devised without departing from the basic scope thereof, and the scope thereof is determined by the claims that follow.

What is claimed is:

1. A method for forming a film layer on a substrate comprising:
supplying a deposition gas mixture including a silicon containing gas and a reacting gas onto a substrate disposed on a substrate support in a processing chamber;
forming a plasma in the presence of the depositing gas mixture in the processing chamber;
applying current to a plasma profile modulator disposed in the processing chamber while supplying the depositing gas mixture into the processing chamber; and
rotating the substrate while depositing a film layer on the substrate.

2. The method of claim 1, wherein applying current to the plasma profile modulator further comprises:
applying current to an electrode disposed in a sidewall of the processing chamber.

3. The method of claim 1, wherein applying current to the plasma profile modulator further comprises:
applying current to an electrode disposed in the substrate support of the processing chamber.

4. The method of claim 1, wherein the reacting gas is selected from a group consisting of oxygen containing gas, a nitrogen containing gas and a carbon containing gas.

5. The method of claim 4, wherein the nitrogen containing gas is selected from a group consisting of $N_2$, $N_2O$, $NO_2$, $NH_3$, and $N_2H_2$.

6. The method of claim 1, wherein applying current to the plasma profile modulator further comprises:
applying current of between about 0.5 A and about 40 A to the processing chamber.

7. The method of claim 1, wherein the film layer has a stress uniformity less than 50%.

8. The method of claim 1, wherein rotating the substrate further comprises:
rotating the substrate at a rotation speed between about 0 rpm and about 100 rpm.

9. The method of claim 1, wherein rotating the substrate further comprises:
rotating the substrate at between about 0 degrees and about 360 degrees around an axis of the substrate support.

10. The method of claim 1, wherein the film layer is a silicon nitride layer.

11. A method for forming a film layer on a substrate comprising:
controlling a plasma generated from a gas mixture in a processing chamber by applying current to a plasma profile modulator disposed in the processing chamber; and
forming a film layer on a substrate with the controlled plasma, wherein the film layer has a local bow range less than 50 μm.

12. The method of claim 11, wherein controlling the plasma further comprises:
applying the current to an electrode disposed in a sidewall of the processing chamber.

13. The method of claim 11, wherein controlling the plasma further comprises:
applying the current to an electrode disposed in a substrate support disposed in the processing chamber.

14. The method of claim 11, further comprising:
rotating the substrate while forming the film layer on the substrate.

15. The method of claim 11, wherein the gas mixture includes a silicon containing gas and a nitrogen containing gas.

16. The method of claim 11, wherein the film layer is a silicon nitride layer.

17. A film structure comprising:
a film stack includes a first film layer and a second film layer disposed on the first layer, wherein the first film layer and the second film layer are alternatively and repeatedly formed in the film stack with a total thickness between about 600 nm and about 4000 nm, wherein the film stack has a local bow range less than 200 μm.

18. The film structure of claim 17, wherein the first film layer is a silicon oxide layer and the second film layer is a silicon nitride layer.

19. The film structure of claim 17, wherein the film stack has about 5 to 90 pairs of alternating first film layers and the second film layers which is utilized to form 3D NAND gate structure for semiconductor devices.

20. The film structure of claim 17, wherein the second film layer is formed by a plasma deposition process with a plasma distribution controlled by a plasma profile modulator disposed in a processing chamber.

* * * * *